(12) United States Patent
Kwon et al.

(10) Patent No.: US 12,453,240 B2
(45) Date of Patent: Oct. 21, 2025

(54) DISPLAY PANEL, STACKED SUBSTRATE INCLUDING THE SAME, AND METHOD OF MANUFACTURING THE DISPLAY PANEL

(71) Applicant: SAMSUNG DISPLAY CO., LTD., Yongin-si (KR)

(72) Inventors: Seungwook Kwon, Hwaseong-si (KR); Ohjune Kwon, Hwaseong-si (KR); Wooyong Sung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 441 days.

(21) Appl. No.: 17/732,262

(22) Filed: Apr. 28, 2022

(65) Prior Publication Data

US 2022/0255041 A1 Aug. 11, 2022

Related U.S. Application Data

(62) Division of application No. 15/700,736, filed on Sep. 11, 2017, now abandoned.

(30) Foreign Application Priority Data

Oct. 26, 2016 (KR) .................. 10-2016-0140332

(51) Int. Cl.
| | | |
|---|---|---|
| H10K 50/84 | (2023.01) | |
| H10K 59/12 | (2023.01) | |
| H10K 59/80 | (2023.01) | |
| H10K 71/00 | (2023.01) | |
| H10K 71/80 | (2023.01) | |

(Continued)

(52) U.S. Cl.
CPC ....... H10K 59/1201 (2023.02); H10K 50/846 (2023.02); H10K 59/12 (2023.02); H10K 59/874 (2023.02); H10K 71/00 (2023.02); H10K 71/80 (2023.02); H10K 77/111 (2023.02); H10K 2102/311 (2023.02)

(58) Field of Classification Search
CPC .... H10K 50/846; H10K 59/874; H10K 59/12; H10K 59/1201; H10K 71/80; H10K 71/00; H10K 77/111; H10K 2102/311; H01L 27/1266
See application file for complete search history.

(56) References Cited

U.S. PATENT DOCUMENTS

| | | |
|---|---|---|
| 5,931,713 A | 8/1999 | Watkins et al. |
| 8,476,634 B2 | 7/2013 | Jeon et al. |
| 9,010,398 B2 | 4/2015 | Kweon et al. |

(Continued)

FOREIGN PATENT DOCUMENTS

| | | |
|---|---|---|
| CN | 1610462 A | 4/2005 |
| CN | 102103284 A | 6/2011 |

(Continued)

*Primary Examiner* — Joshua Benitez Rosario
*Assistant Examiner* — John Lin
(74) *Attorney, Agent, or Firm* — Womble Bond Dickinson (US) LLP

(57) ABSTRACT

A display panel includes a base substrate having a first surface and a second surface opposing each other, a pixel part located on the first surface, and including a plurality of pixels, and a remaining part on the second surface to cover at least a portion of the second surface, and including a moisture absorption material having a moisture absorption property.

8 Claims, 14 Drawing Sheets

(51) Int. Cl.
*H10K 77/10* (2023.01)
*H10K 102/00* (2023.01)

(56) References Cited

U.S. PATENT DOCUMENTS

| | | | |
|---|---|---|---|
| 9,039,476 B2 | 5/2015 | Song et al. | |
| 9,070,895 B2 | 6/2015 | Lin | |
| 9,246,132 B2 | 1/2016 | Kang et al. | |
| 9,263,709 B2 | 2/2016 | Lee et al. | |
| 2004/0081852 A1 | 4/2004 | Chen et al. | |
| 2005/0110402 A1 | 5/2005 | Tanaka | |
| 2005/0218795 A1 | 10/2005 | Lee et al. | |
| 2005/0285513 A1 | 12/2005 | Choi et al. | |
| 2007/0172971 A1* | 7/2007 | Boroson | H10K 50/8426 438/26 |
| 2008/0150419 A1 | 6/2008 | Kang | |
| 2013/0126854 A1 | 5/2013 | Nakamura et al. | |
| 2013/0240848 A1 | 9/2013 | Lin | |
| 2013/0240862 A1* | 9/2013 | Yoo | H01L 23/295 523/400 |
| 2013/0248827 A1 | 9/2013 | Togano et al. | |
| 2014/0042649 A1 | 2/2014 | Ke et al. | |
| 2014/0339527 A1 | 11/2014 | Lee et al. | |
| 2015/0115235 A1 | 4/2015 | Lee et al. | |
| 2015/0187849 A1 | 7/2015 | Kachatryan et al. | |
| 2015/0188084 A1 | 7/2015 | Kang et al. | |
| 2015/0372255 A1* | 12/2015 | Fukumoto | H10K 59/873 438/26 |

FOREIGN PATENT DOCUMENTS

| | | |
|---|---|---|
| CN | 102760846 A | 10/2012 |
| CN | 103325953 A | 9/2013 |
| CN | 103540269 A | 1/2014 |
| CN | 104128705 A | 11/2014 |
| CN | 104377118 A | 2/2015 |
| JP | 2000-133809 A | 5/2000 |
| JP | 2005202094 A | 7/2005 |
| JP | 2009042559 A | 2/2009 |
| KR | 10-2012-0063276 A | 6/2012 |
| KR | 10-2012-0078291 A | 7/2012 |
| KR | 20130047971 A | 5/2013 |
| KR | 20140063302 A | 5/2014 |
| KR | 1020140129775 A | 11/2014 |
| KR | 10-1500684 B1 | 3/2015 |
| KR | 1020150031991 A | 3/2015 |
| KR | 20150049189 A | 5/2015 |
| KR | 20150080864 A | 7/2015 |
| KR | 20160068336 A | 6/2016 |
| WO | WO 2014/031372 A1 | 2/2014 |
| WO | 2015012339 A1 | 1/2015 |

* cited by examiner

DISPLAY PANEL, STACKED SUBSTRATE INCLUDING THE SAME, AND METHOD OF MANUFACTURING THE DISPLAY PANEL

CROSS-REFERENCE TO RELATED APPLICATIONS

This application is a divisional of U.S. patent application Ser. No. 15/700,736, filed Sep. 11, 2017, which claims priority to and the benefit of Korean Patent Application No. 10-2016-0140332, filed Oct. 26, 2016, the entire content of both of which is incorporated herein by reference.

BACKGROUND

1. Field

Aspects of the present disclosure herein relate to a display panel having improved reliability, a stacked substrate including the same, and a method of manufacturing the display panel.

2. Description of the Related Art

Display panels display images to provide a user with information. The display panels include a base substrate, and a display device located on the base substrate. The display device may generate an image according to an electrical signal.

Because display panels include a base substrate having flexibility, a flexible display panel may be provided. The flexible display panel is provided in a manner in which the flexible substrate is provided to the carrier substrate, and the display device and the like are located on the base substrate through depositing and patterning, and then the base substrate is separated from the carrier substrate.

SUMMARY

The present disclosure describes a display panel that is easily separated from a carrier substrate without adding processes, such as a laser irradiation and the like, and a method of manufacturing the same.

The present disclosure also describes a stacked substrate in which a coupling force between the carrier substrate and the display panel is easily controlled.

An embodiment of the inventive concept provides a display panel including a base substrate having a first surface and a second surface opposing each other, a pixel part located on the first surface, and including a plurality of pixels, and a remaining part on the second surface to cover at least a portion of the second surface, and including a moisture absorption material having a moisture absorption property.

The moisture absorption material may include at least one of metal, metal oxide, silicon oxide, chloride, sulfur oxide, bromine compound, fluorine compound, or indium compound.

The remaining part may entirely cover the second surface.

The base substrate may include a resin.

The pixel part may include an array layer on the first surface of the base substrate, and including a plurality of thin film transistors, a display element layer on the array layer, and including a plurality of organic light emitting diodes respectively connected to the plurality of thin film transistors, and an encapsulation layer encapsulating the display element layer.

The display panel may further include a protection substrate below the base substrate, wherein the remaining part is between the protection substrate and the base substrate.

In an embodiment of the inventive concept, a stacked substrate including a carrier substrate, a base part on the carrier substrate, a moisture absorption layer between the carrier substrate and the base part, and including a moisture absorption material, and a pixel part on the base part, and including a plurality of pixels.

The moisture absorption material may include at least one of metal, metal oxide, silicon oxide, chloride, sulfur oxide, bromine compound, fluorine compound, or indium compound.

The moisture absorption layer may define at least one pore.

The carrier substrate may include a material that is different from a material of the base part.

The carrier substrate may include glass, and the base part may include a resin.

The base part may cover a top surface of the moisture absorption layer and side surfaces of the moisture absorption layer.

In an embodiment of the inventive concept, a method of manufacturing a display panel includes providing a carrier substrate, forming a moisture absorption layer including a moisture absorption material on the carrier substrate, forming a base part on the moisture absorption layer, forming a pixel part including a plurality of pixels on the base part, injecting moisture into the moisture absorption layer to deform the moisture absorption layer, and separating the base part and the pixel part from the carrier substrate to form the display panel.

The moisture absorption material may include at least one of metal, metal oxide, silicon oxide, chloride, sulfur oxide, bromine compound, fluorine compound, or indium compound.

The moisture absorption layer is deformed by the injected moisture to define at least one pore.

Injecting moisture into the moisture absorption layer may cause the moisture absorption layer to expand in volume due to the injected moisture.

The method may further include forming the base part through a solution process.

Forming the base part may include covering a top surface and side surfaces of the moisture absorption layer with the base part, the method further including removing a portion of the base part prior to the injecting of the moisture to expose the side surfaces of the moisture absorption layer.

Removing the portion of the base part may include cutting the base part along a cutting line defined on the base part, the removed portion of the base part not overlapping the moisture absorption layer in a plan view.

The separating the base part and the pixel part from the carrier substrate may include applying a vacuum to the carrier substrate or to the base part to pull the carrier substrate and the base part in opposite directions.

BRIEF DESCRIPTION OF THE DRAWINGS

The accompanying drawings are included to provide a further understanding of the inventive concept, and are incorporated in, and constitute a part of, this specification. The drawings illustrate embodiments of the inventive concept and, together with the description, serve to explain principles of the inventive concept. In the drawings.

DETAILED DESCRIPTION

Figure 1A:
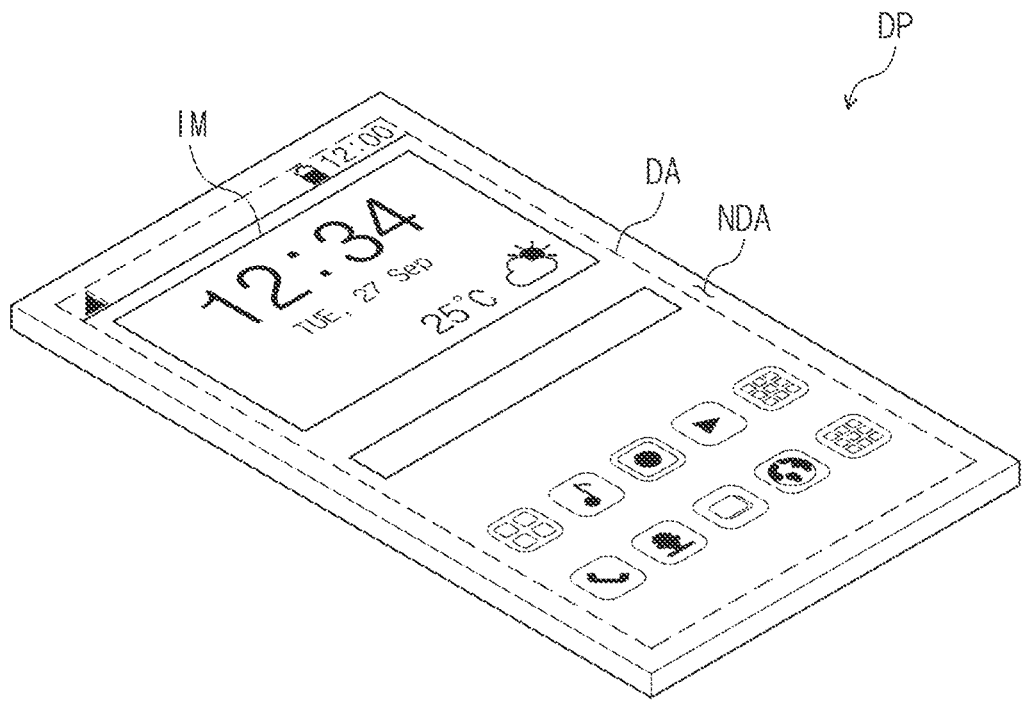
FIG. 1A is a perspective view of a display panel according to an embodiment of the inventive concept.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
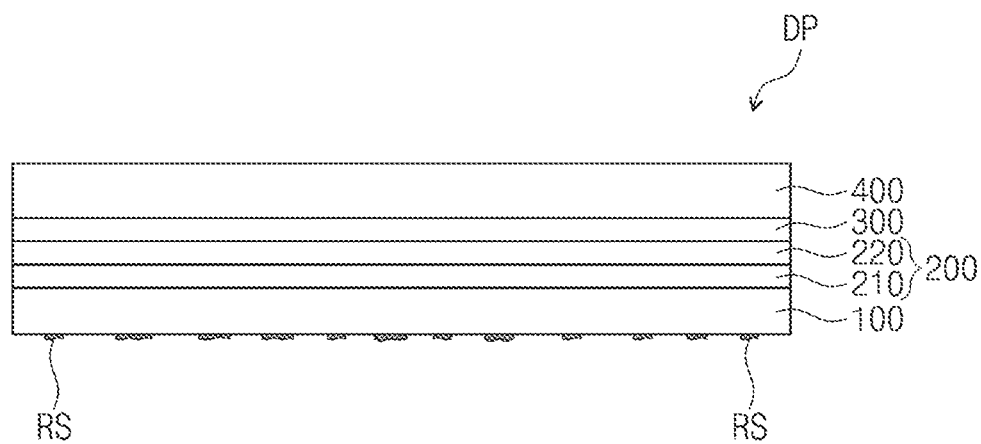
FIG. 1B is a cross-sectional view of the display panel illustrated in FIG. 1A.
Figure 2:
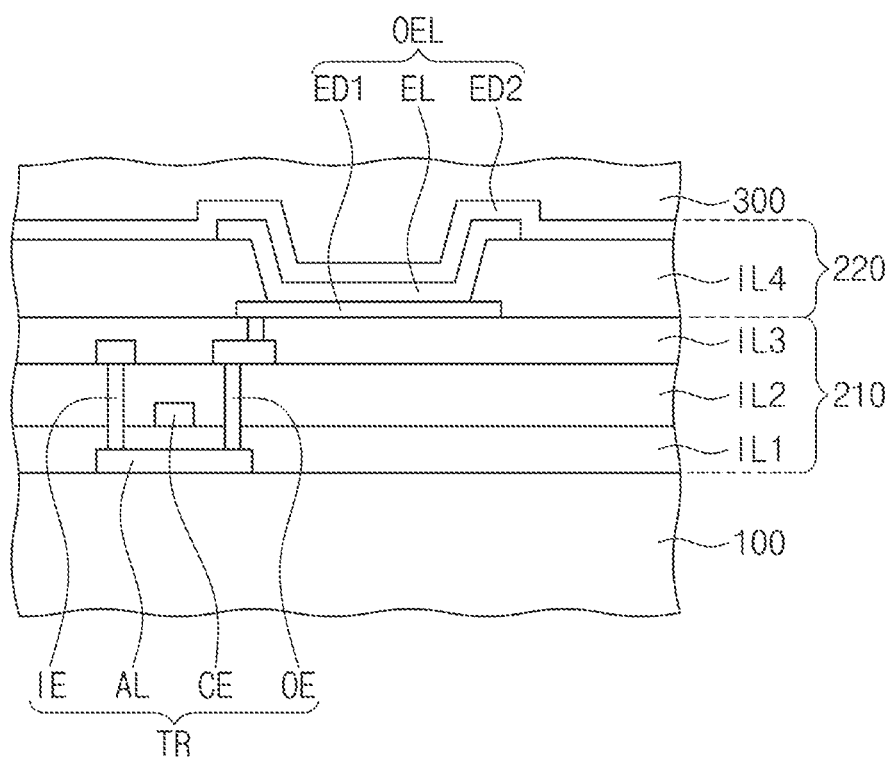
FIG. 2 is a cross-sectional view illustrating a portion of the display panel of FIG. 1B.

FIG. 1A is a perspective view of a display panel according to an embodiment of the inventive concept. FIG. 1B is a cross-sectional view of the display panel illustrated in FIG. 1A. FIG. 2 is a cross-sectional view illustrating a portion of the display panel of FIG. 1B. Hereinafter, a display panel DP according to an embodiment of the inventive concept will be described with reference to FIGS. 1A, 1B, and 2.

As illustrated in FIG. 1A, the display panel DP is divided into a display area DA and a peripheral area NDA on a plane. A plurality of pixels may be located at the display area DA. The display panel DP receives an electrical signal to display an image IM at the display area DA. The display panel DP provides a user with information through the image IM.

The peripheral area NDA is adjacent the display area DA. In the present embodiment, although the peripheral area NDA is illustrated in a frame shape surrounding edges of the display area DA, this is merely illustrated as an example. The peripheral area NDA may have a shape including partially adjacent edges of the display area DA, and is not limited to any particular embodiment.

As illustrated in FIG. 1B, the display panel DP may include a plurality of stacked elements on a cross-sectional plane. For example, the display panel DP may include a base part/base substrate 100, a pixel part 200, an encapsulation layer 300, a protection substrate 400, and a remaining part RS.

The base substrate 100 may be provided in a shape of a substrate having a hexahedral plate shape with a top surface, a bottom surface, and a plurality of side surfaces. In the current embodiment, the pixel part 200, the encapsulation layer 300, and the protection substrate 400 may be stacked on the top surface of the base substrate 100.

The base substrate 100 may be an insulation substrate. The base substrate 100 may have flexible characteristics, and may be optically transparent. For example, the base substrate 100 may include a resin formed of an organic material. Particularly, the base substrate 100 may include at least any one of polyimide, polycarbonate, polyester, or polyacrylate.

The pixel part 200 is located on the top surface on the base substrate 100. The pixel part 200 may include a plurality of pixels. The pixels may be arranged at the display area DA. Each of the pixels receives an electrical signal to display light for realizing the image IM.

Referring to FIGS. 1B and 2, the pixel part 200 includes an array layer 210 and a display element layer 220. The array layer 210 may include a plurality of insulation layers IL1, IL2, and IL3 and a plurality of thin film transistors TR. The thin film transistors TR enable functioning of respective ones of the pixels. In FIG. 2, one thin film transistor TR is illustrated as an example for ease of description.

The thin film transistor TR may include a semiconductor pattern AL, a control electrode CE, an input electrode IE, and an output electrode OE. The semiconductor pattern AL may be located between the base substrate 100 and the first insulation layer IL1. The semiconductor pattern AL may include a semiconductor material.

The control electrode CE may be located between the first insulation layer IL1 and the second insulation layer IL2. The control electrode CE overlaps at least a portion of the semiconductor pattern AL on a plane (e.g., in a plan view). The control electrode CE is spaced apart from the semiconductor pattern AL with the first insulation layer IL1 therebetween.

The input electrode IE is located between the second insulation layer IL2 and the third insulation layer IL3. The input electrode IE may pass through the second insulation layer IL2 and the first insulation layer IL1, and may thus be electrically connected to the semiconductor pattern AL.

The output electrode OE is located between the second insulation layer IL2 and the third insulation layer IL3. The output electrode OE may be located on the same layer as the input electrode IE. The output electrode OE is spaced apart from the input electrode IE on a plane/in a plan view. The output electrode OE may pass through the second insulation layer IL2 and the first insulation layer IL1, and may thus be electrically connected to the semiconductor pattern AL.

However, this is merely illustrated as an example, and the thin film transistor TR may have various structures. For example, in the thin film transistor TR according to an embodiment of the inventive concept, the control electrode CE may be located on the semiconductor pattern AL or located on the input electrode IE or the output electrode OE. Also, in the thin film transistor TR according to an embodiment of the inventive concept, the input electrode IE and the output electrode OE may be located to directly contact the semiconductor pattern AL without a respective separate through hole. The display panel DP according to an embodiment of the inventive concept may include thin film transistors TR having various structures, and is not limited to any particular embodiment.

The display element layer 220 is located above the base substrate 100. The display element layer 220 may include a plurality of display devices connected to respective ones of the thin film transistors TR. The display devices may generate light corresponding to the electrical signal or control light transmittance.

In the current embodiment, the display element layer 220 including an organic light emitting diode (OLED) as a display device is illustrated as an example. Therefore, the display element layer 220 may include an insulation layer (e.g., a fourth insulation layer) IL4 and an OLED OEL.

The OLED OEL includes a first electrode ED1, a light emitting layer EL, and a second electrode ED2. The first electrode ED1 is located between the third insulation layer IL3 and the fourth insulation layer IL4. The first electrode ED1 may pass through the third insulation layer IL3, and may thus be connected to the thin film transistor TR (e.g., the output electrode OE). However, this is merely illustrated as an example, and the first electrode ED1 may be directly connected to the output electrode OE without a separate through hole.

Also, the fourth insulation layer IL4 is located on the third insulation layer IL3 to expose at least a portion of the first electrode ED1 (e.g., via a hole through the fourth insulation layer IL4). In the current embodiment, the first electrodes ED1 that constitute each of the OLEDs OEL may have a predetermined pattern. Accordingly, a plurality of openings for respectively exposing the first electrodes ED1 are defined in the fourth insulation layer IL4.

The light emitting layer EL is located on the first electrode ED1. The light emitting layer EL may be located in the opening defined in the fourth insulation layer IL4. The light emitting layer EL may include a light emitting material that generates light according to an electric field. In the current embodiment, the light emitting layer EL may include an organic light emitting material. However, this is merely illustrated as an example. If the display element layer 220 includes an inorganic light emitting diode, the light emitting layer EL may include an inorganic light emitting material, and is not limited to any particular embodiment.

The OLED OEL emits light having a color generated by the light emitting layer EL. Each of a plurality of the pixels, according to the OLED OEL of the corresponding pixel, may emit light having a color that is distinguishable from that of an adjacent pixel, and/or may also emit light having the same color as an adjacent pixel. Also, the light emitting layer EL may be provided in plurality. In this case, the OLED OEL may emit light having a color that is obtained by mixing light generated from the plurality of light emitting layers.

The second electrode ED2 is located on the light emitting layer EL. The second electrode ED2 may face the first electrode ED1. The second electrode ED2 may receive a voltage that is different from that of the first electrode ED1. The OLED OEL controls light emission of the light emitting layer EL through a voltage difference between the first electrode ED1 and the second electrode ED2.

Also, the OLED OEL may further include additional layers located between the first electrode ED1 and the second electrode ED2. Each of the additional layers are located between the first electrode ED1 and the light emitting layer EL, or are located between the second electrode ED2 and the light emitting layer EL, to improve mobility of an electric charge, or to prevent an electric charge from escaping. Alternatively, each of the additional layers may be located between the light emitting layers EL to additionally generate an electric charge. The OLED OEL according to an embodiment of the inventive concept may further include additional layers to have improved light emission efficiency.

The encapsulation layer 300 is located on the pixel part 200. The encapsulation layer 300 may cover the second electrode ED2. The encapsulation layer 300 may include a plurality of organic films and/or inorganic films. The encapsulation layer 300 may reduce or prevent exposure of the OLED OEL to external moisture.

The protection substrate 400 is located on the encapsulation layer 300. The protection substrate 400 may include a transparent insulating material. For example, the protection substrate 400 may include polyethylene terephthalate (PET). The protection substrate 400 may protect the pixel part 200 and the encapsulation layer 300 from the outside environment.

The remaining part RS is located on the bottom surface of the base substrate 100. The remaining part RS is located on a surface opposite to the surface on which the pixel part 200 is located. The remaining part RS may cover at least a portion of the bottom surface of the base substrate 100. The remaining part RS contacts the base substrate 100. The remaining part RS may be in a state of being attached to the base substrate 100.

In the current embodiment, the remaining part RS may be provided in plurality, and may distributed on the bottom surface of the base substrate 100. The plurality of remaining parts RS may be randomly arranged on the bottom surface of the base substrate 100.

The remaining part RS has a moisture absorption property/a property of absorbing moisture. The moisture may include water ($H_2O$). The moisture absorption may include physical absorption of drawing moisture, and may also include cases in which physical or chemical changes are generated by reacting with the moisture. The material of the remaining part RS having the moisture absorption property may include at least one of metal, metal oxide, silicon oxide, chloride, sulfur oxide, bromine compound, fluorine compound, or indium compound.

For example, the remaining part RS may include a material having the moisture absorption property, such as SiO, W, $P_2O_5$, $Li_2O$, $Na_2O$, BaO, CaO, MgO, $Li_2SO_4$, $Na_2SO_4$, $MgSO_4$, $CoSO_4$, $Ga_2(SO_4)_3$, $Ti(SO_4)_2$, $NiSO_4$, $CaCl_2$), $MgCl_2$, $SrCl_2$, $YCl_3$, $CuCl_2$, CsF, $VBr_3$, $MgBr_2$, $BaI_2$, $MgI_2$, $Ba(ClO_4)_2$, or $Mg(ClO_4)_2$. However, this is merely described as an example. The remaining part RS according to an embodiment of the inventive concept may include various materials having moisture absorption properties, and is not limited to one particular embodiment.

Figure 3A:
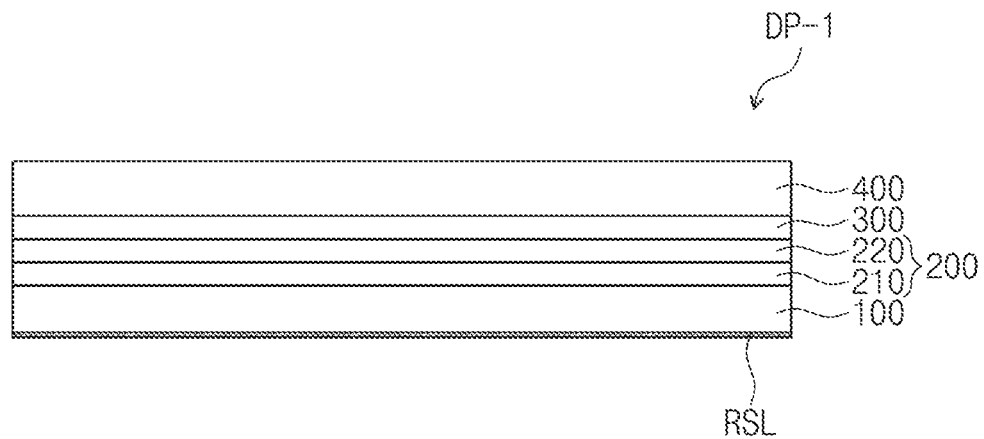
FIGS. 3A and 3B are cross-sectional views of a display panel according to an embodiment of the inventive concept.
Figure 3B:
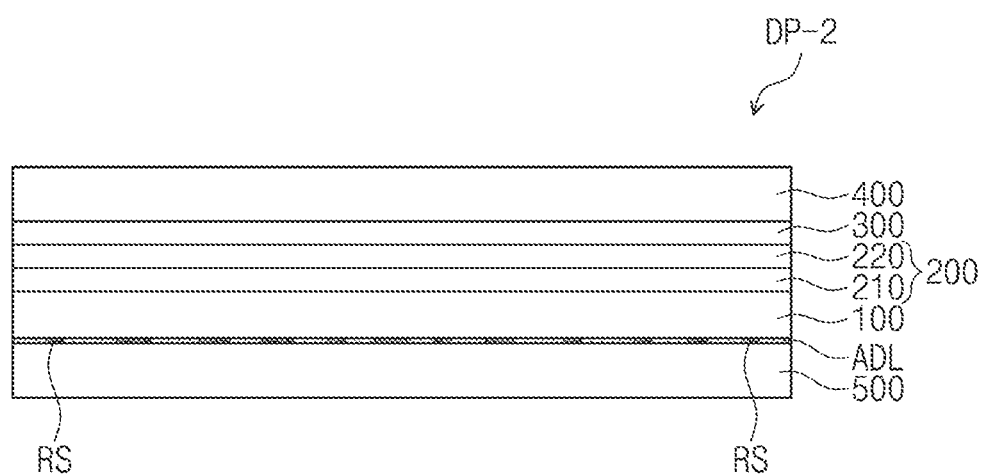

FIG. 3A is a cross-sectional view according to an embodiment of the inventive concept. FIG. 3B is a cross-sectional view according to an embodiment of the inventive concept. FIGS. 3A and 3B are illustrated to correspond to FIG. 1B for ease of description.

Hereinafter, display panels DP-1 and DP-2 according to an embodiment of the inventive concept will be described with reference to FIGS. 3A and 3B. However, the same reference numerals are given to the same elements corresponding to those in FIGS. 1A to 2, and duplicated descriptions will be omitted.

According to an embodiment of the inventive concept, a remaining part RSL may have various shapes. For example, as illustrated in FIG. 3A, the remaining part RSL may have a layer shape in the display panel DP-1. The remaining part RSL may entirely cover the bottom surface of the base substrate 100, or may entirely overlap the base substrate 100.

Also, as illustrated in FIG. 3B, the display panel DP-2 may further include a lower protection member 500. The lower protection member 500 may be located at one side of the base substrate 100. The lower protection member 500 may protect the pixel part 200 at the lower side of the base substrate 100, and may define an exterior of, or a portion of an exterior of, the display panel DP-2. The lower protection member 500 may include the same material as the base substrate 100, or may include a material having rigidity that is greater than that of the base substrate 100.

The remaining part RS may be located between the lower protection member 500 and the base substrate 100. The lower protection member 500 may contact the remaining part RS. In the current embodiment, the remaining part RS is illustrated to correspond to the remaining part RS illustrated in FIG. 1B.

The lower protection member 500 may be coupled to the base substrate 100 through a predetermined adhesion layer ADL. However, this is merely illustrated as an example. The adhesion layer ADL may be omitted in the display panel DP-2 according to an embodiment of the inventive concept.

In the display panel DP-1, according to an embodiment of the inventive concept, the lower protection member 500 may be located in spaced relation from the base substrate 100 with the remaining part RSL therebetween.

If the remaining parts RS and RSL according to an embodiment of the inventive concept cover at least a portion of the bottom surface of the base substrate 100, the remaining parts RS and RSL may have various shapes, and are not limited to one particular example. Also, the lower protection member 500 may cover the remaining parts RS and RSL according to an embodiment of the inventive concept at the bottom surface of the base substrate 100, and may protect the base substrate 100.

FIGS. 4A to 4K are cross-sectional views illustrating a method of manufacturing a display panel according an embodiment of the inventive concept. Hereinafter, a method of manufacturing the display panel according to an embodiment of the inventive concept will be described with reference to FIGS. 4A to 4K.

Figure 4A:
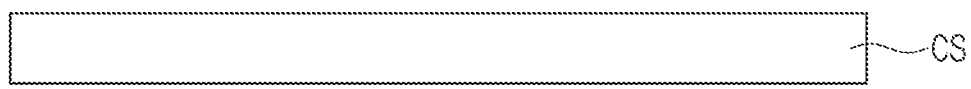
FIGS. 4A to 4K are cross-sectional views illustrating a method of manufacturing a display panel according to an embodiment of the inventive concept.
Figure 4B:
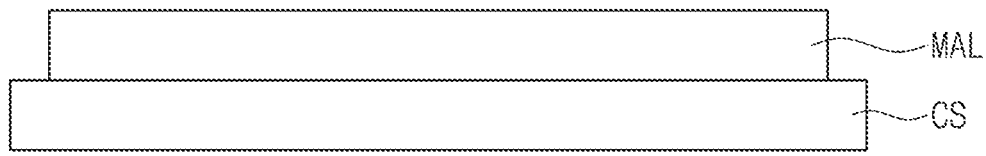

As illustrated in FIGS. 4A and 4B, a moisture absorption layer MAL is formed on a carrier substrate CS. The carrier substrate CS may be a substrate that moves along a processing line for forming elements of the display panel DP during the manufacturing process of the display panel DP.

In the current embodiment, the carrier substrate CS may have comparatively rigid characteristics and insulative characteristics. The carrier substrate CS may include a material that is different from that of the base substrate 100 illustrated in FIG. 1B. For example, the carrier substrate CS may include glass.

The moisture absorption layer MAL of the carrier substrate CS may be formed by depositing or applying a material having moisture absorption properties on the carrier substrate CS.

The moisture absorption layer MAL may be made of a moisture absorption material that reacts with water or moisture. For example, the moisture absorption layer MAL may include at least one of metal, metal oxide, silicon oxide, chloride, sulfur oxide, bromine compound, fluorine compound, or indium compound. The moisture absorption layer MAL may include a material having moisture absorption property such as $SiO$, $W$, $P_2O_5$, $Li_2O$, $Na_2O$, $BaO$, $CaO$, $MgO$, $Li_2SO_4$, $Na_2SO_4$, $MgSO_4$, $CoSO_4$, $Ga_2(SO_4)_3$, $Ti(SO_4)_2$, $NiSO_4$, $CaCl_2$), $MgCl_2$, $SrCl_2$, $YCl_3$, $CuCl_2$, $CsF$, $VBr_3$, $MgBr_2$, $BaI_2$, $MgI_2$, $Ba(ClO_4)_2$, or $Mg(ClO_4)_2$. However, this is merely described as an example. If the moisture absorption layer MAL includes a material reacting with water or moisture, the moisture absorption layer MAL may have various embodiments, and is not limited to one particular embodiment.

Figure 4C:
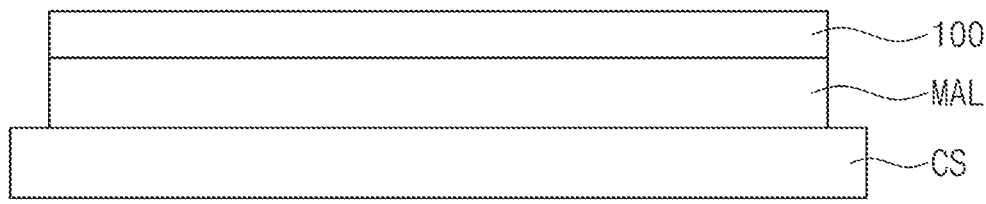

Hereinafter, a base substrate 100 is formed on the moisture absorption layer MAL as illustrated in FIG. 4C. The base substrate 100 may be formed by a coating or a laminating process. For example, the base substrate 100 may be formed by applying an insulating material on the moisture absorption layer MAL. Alternatively, the base substrate 100 may be formed by laminating an insulation substrate on the moisture absorption layer MAL.

The base substrate 100 may include a material that is different from that of the carrier substrate CS. The base substrate 100 may include a material that is relatively flexible when compared to the material of the carrier substrate CS. For example, the base substrate 100 may include at least one of polyimide, polycarbonate, polyester, or polyacrylate.

Here, the base substrate 100 is formed in spaced relation from the carrier substrate CS with the moisture absorption layer MAL therebetween. The base substrate 100 might not contact the carrier substrate CS.

Figure 4D:
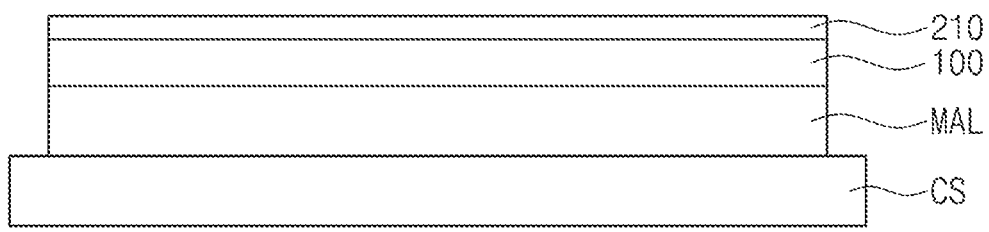

Then, an array layer 210 is formed on the base substrate 100, as illustrated in FIG. 4D. The array layer 210 may include a plurality of insulation layers, a semiconductor layer, and a plurality of conductive layers. A portion of the conductive layers and the semiconductor layer may constitute a portion of a thin film transistor.

In the current embodiment, the array layer 210 may be formed by the low-temperature silicon process. Thus, although the base substrate 100 is made of a material having low thermal stability, the array layer 210 may be stably formed on the base substrate 100.

Figure 4E:
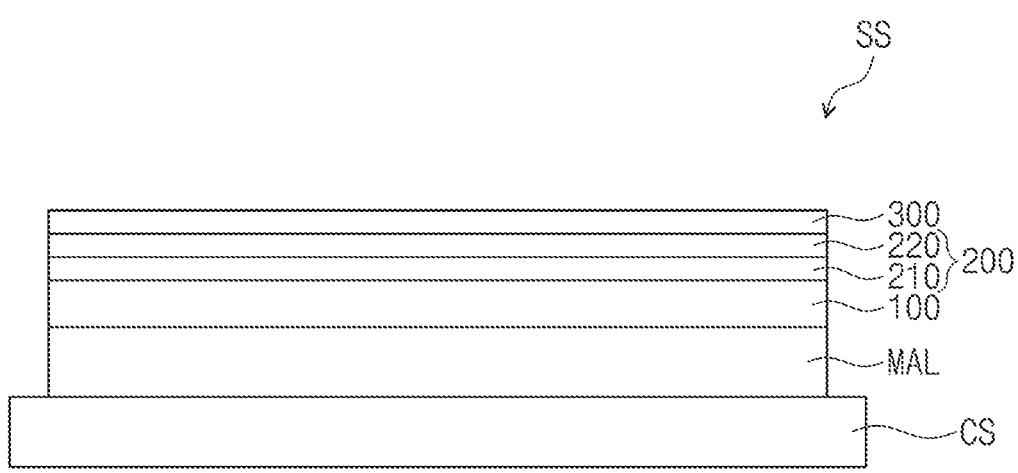

Then, as illustrated in FIG. 4E, a display element layer 220 and an encapsulation layer 300 may be formed to form a stacked substrate SS. The array layer 210 and the display element layer 220 may be elements of the pixel part 200. Accordingly, the stacked substrate SS may include the carrier substrate CS, the moisture absorption layer MAL, the pixel part 200, and the encapsulating layer 300.

The display element layer 220 may be formed on the array layer 210. The display element layer 220 may include a plurality of display devices electrically connected to the array layer 210. In the current embodiment, the display devices may be organic light emitting diodes. The array layer 210 may be formed by a depositing or a coating process.

The encapsulation layer 300 may be formed on the display element layer 220. The encapsulation layer 300 may include an organic film and/or an inorganic film. The encapsulation layer 300 may be formed by depositing or coating.

Figure 4F:
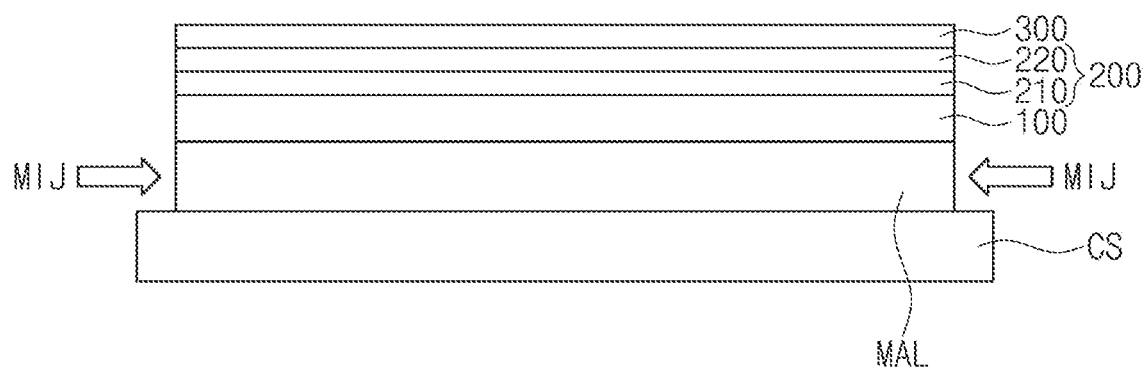
Figure 4G:
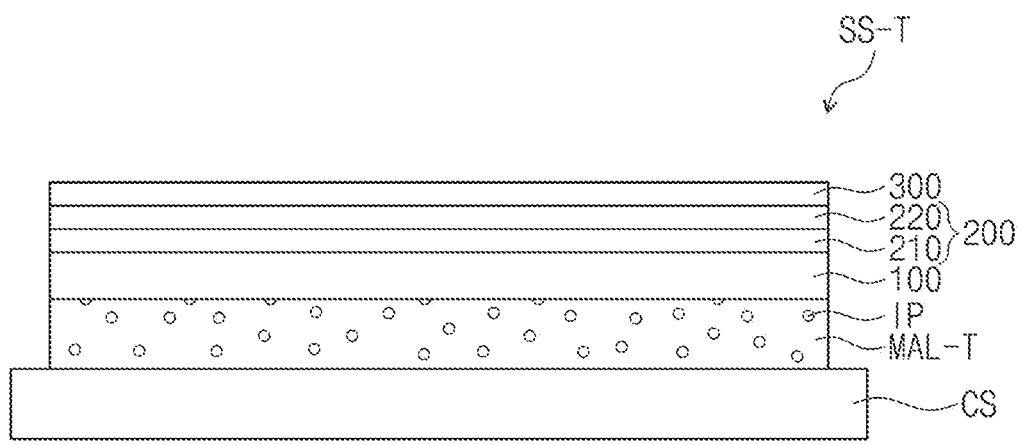

Then, and shown in FIG. 4F, water MIJ is injected into the stacked substrate SS to form a modified version of a stacked substrate SS-T. When the moisture MIJ is supplied to the stacked substrate SS, the supplied water MIJ is absorbed in the moisture absorption layer MAL to change the moisture absorption layer MAL into a modified moisture absorption layer MAL-T, as shown in FIG. 4G.

The modified moisture absorption layer MAL-T may have a porous structure. For example, the moisture absorption layer MAL may react with the supplied water MIJ to generate bubbles and the like. When the bubbles are generated, the bubbles may be present, or empty spaces from which the bubbles are removed may be formed in a portion of the moisture absorption layer MAL having a relatively dense structure, and thus the moisture absorption layer MAL may be changed into the porous moisture absorption layer MAL-T having the porous structure.

Also, the moisture absorption layer MAL may cause reaction with the water MIJ in various manners according to its forming material. For example, the moisture absorption layer MAL may react with the water MIJ to cause a swelling reaction. Here, deformation that occurs in the moisture absorption layer MAL may be volume expansion. However, this is merely described as an example. The stacked substrate SS according to an embodiment of the inventive concept may include the moisture absorption layer MAL that reacts with moisture in various manners and is not limited to one embodiment.

Accordingly, the stacked substrate SS-T may include the porous moisture absorption layer MAL-T having at least one pore IP. The pore IP may be an empty space, or may be a region in which the bubbles are present. The contact area between the porous moisture absorption layer MAL-T and the base substrate 100 may be relatively less than the contact area between the moisture absorption layer MAL and the base substrate 100. According to an embodiment of the inventive concept, because the moisture absorption layer MAL is changed into the porous structure, coupling force between the base substrate 100 and the moisture absorption layer MAL decreases.

Figure 4H:
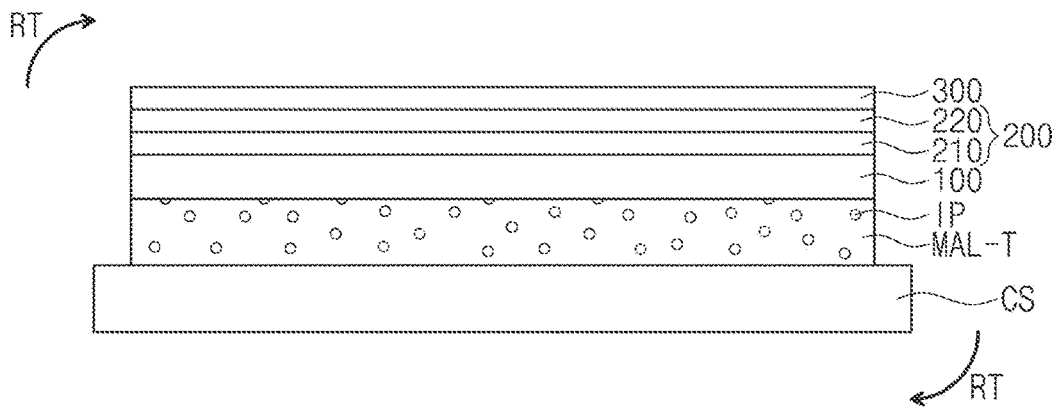

Then, as illustrated in FIG. 4H, the stacked substrate SS-T may be rearranged by being rotated 180 degrees along a rotational direction RT. Therefore, the bottom surface of the carrier substrate CS faces upward, and the encapsulation layer 300 faces downward.

Figure 4I:
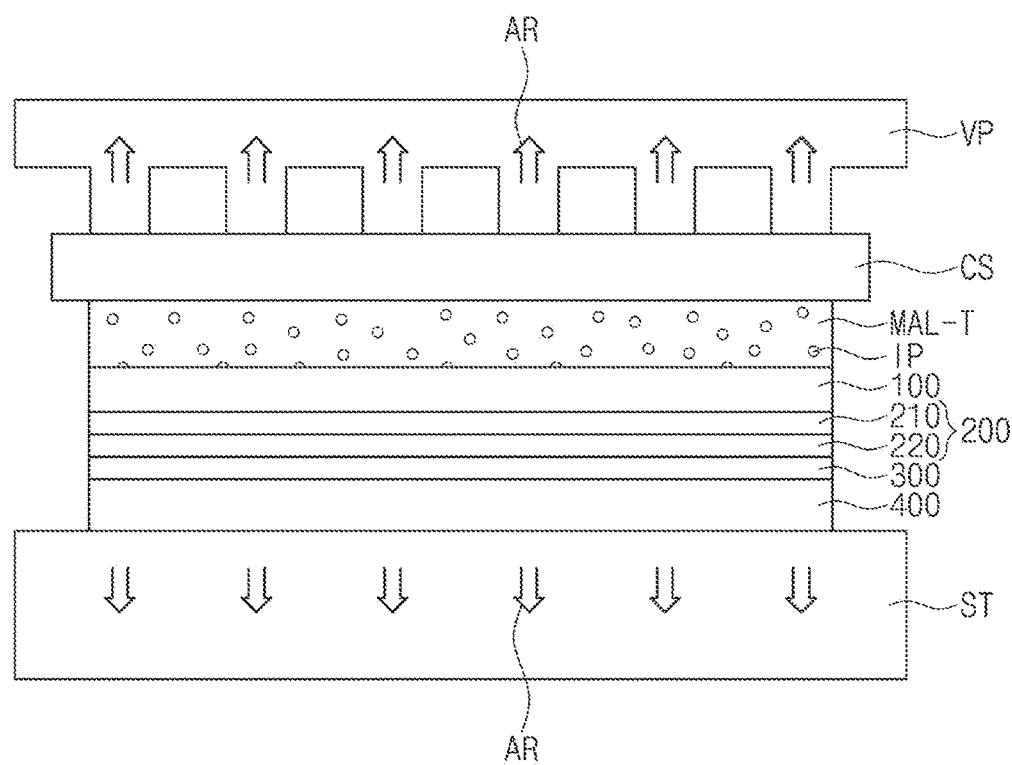

Then, as illustrated in FIG. 4I, the stacked substrate SS-T may be provided on a stage ST in the rearranged state. Also, the stacked substrate SS-T may further include a protection substrate 400. The protection substrate 400 may be formed before or after the stacked substrate SS-T is rearranged. The protection substrate 400 may be attached to the encapsulation layer 300.

The stage ST may have a vacuum stage. Particularly, the stage ST may draw air AR through a plurality of vacuum holes defined in the top surface of the stage ST, and the protection substrate 400 may cling to the stage ST due to suction. Therefore, one side of the stacked substrate SS-T may be fixed to the stage ST.

Also, the other side of the stacked substrate SS-T may be coupled to a vacuum pad VP. The vacuum pad VP contacts the carrier substrate CS, and then draws air AR to allow the carrier substrate CS to adhere to the vacuum pad VP. Thus, the other side of the stacked substrate SS-T may be fixed to the vacuum pad VP.

Figure 4J:
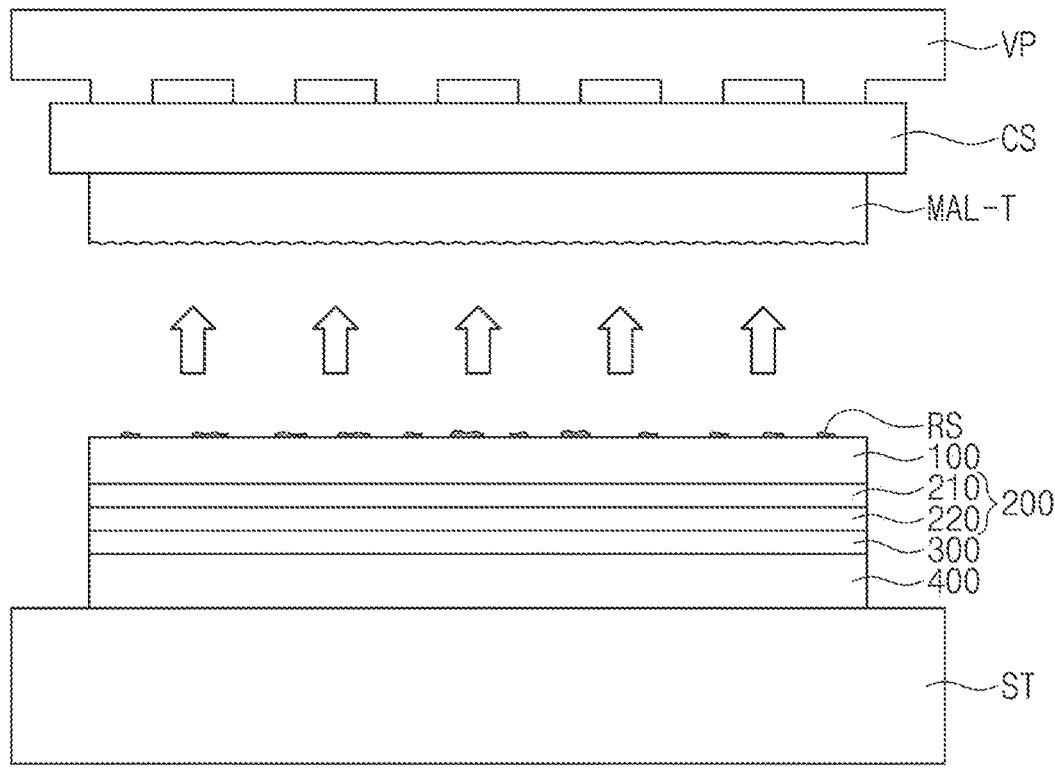
Figure 4K:
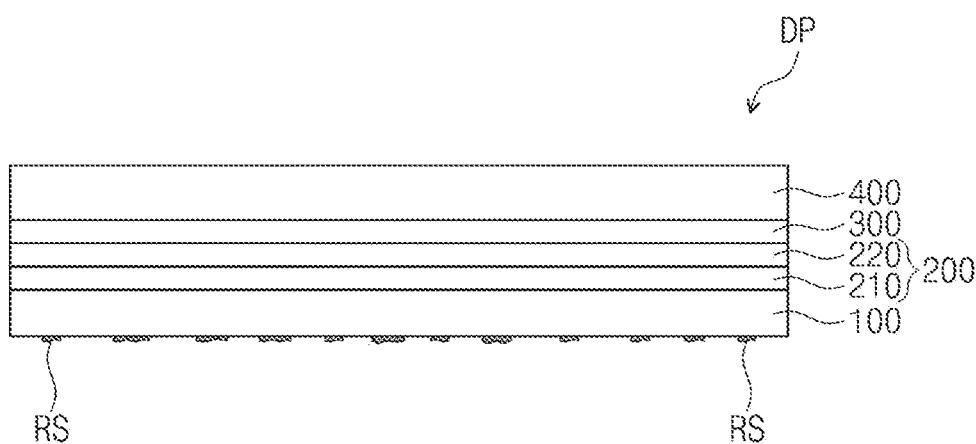

Then, as illustrated in FIGS. 4J and 4K, the carrier substrate CS is separated from the stacked substrate SS-T to form a display panel DP. When the vacuum pad VP is made to move in an arrow direction, as shown in FIG. 4J, to increase the spaced distance between the vacuum pad VP and the stage ST, two forces of opposite directions are applied to the stacked substrate SS-T. Particularly, a downward pulling force may be applied to one side of the stacked substrate SS-T fixed by the stage ST, and an upward pulling force may be applied to the other side of the stacked substrate SS-T fixed by the vacuum pad VP.

The two relative forces provided to the stacked substrate SS-T may be applied to each of the layers forming the stacked substrate SS-T, and to interfaces between the layers. Here, because the porous moisture absorption layer MAL-T includes the plurality of pores IP, the porous moisture absorption layer MAL-T may have relatively low coupling force between the layers when compared to the coupling force between the other layers having a dense structure. According to an embodiment of the inventive concept, the base substrate 100 may be easily delaminated from the carrier substrate CS by applying the two forces in opposite directions.

Here, a remaining part RS may be formed on one surface of the base substrate 100. A portion of the porous moisture absorption layer MAL-T may remain to form the remaining part RS. Thus, the remaining part RS may be formed in various shapes according to a degree of coupling between the porous moisture absorption layer MAL-T and the base substrate 100, and according to the number of pores IP included in the porous moisture absorption layer MAL-T.

For example, when the porous moisture absorption layer MAL-T includes the relatively small number of pores IP, or when the degree of coupling between the porous moisture absorption layer MAL-T and the base substrate 100 increases, the remaining part RS remaining on the base substrate 100 may have a larger area. Here, the remaining part RS may be formed in a shape of a layer to cover the entire surface of the base substrate 100.

Alternatively, when the porous moisture absorption layer MAL-T includes the relatively large number of pores IP, or when the degree of coupling between the porous moisture absorption layer MAL-T and the base substrate 100 decreases, the remaining part RS remaining on the base substrate 100 may have a smaller area. Therefore, in the display panel DP in the manufacturing method according to an embodiment of the inventive concept, the remaining part RS may be omitted.

In the method of manufacturing the display panel according to an embodiment of the inventive concept, the carrier substrate CS is physically separated from the base substrate 100 by using the forces applied in opposite directions. Accordingly, heat treatment processes, such as a laser process for separating the carrier substrate CS from the base substrate 100 may be omitted.

The stacked substrate SS according to an embodiment of the inventive concept may further include the moisture absorption layer MAL to easily control the coupling force between the carrier substrate CS and the base substrate 100. According to an embodiment of the inventive concept, the stacked substrate SS including the moisture absorption layer MAL with a dense structure, and the stacked substrate SS-T including the moisture absorption layer MAL-T with a porous structure, may be easily provided, and thus the coupling force between the carrier substrate CS and the base substrate 100 may be controlled.

Also, in the method of manufacturing the display panel according to an embodiment of the inventive concept, the porous moisture absorption layer MAL-T may be formed by reacting with moisture to decrease the coupling force between the carrier substrate CS and the base substrate 100. Accordingly, the carrier substrate CS may be stably separated from the base substrate 100 without using a laser, and thermal damage to the display panel DP may be prevented during the separation process between the carrier substrate CS and the base substrate 100.

FIGS. 5A to 5G are cross-sectional views illustrating a method of manufacturing a display panel according to an embodiment of the inventive concept. Hereinafter, the method of manufacturing the display panel according to an embodiment of the inventive concept will be described with reference to FIGS. 5A to 5G. However, the same reference numerals are given to the same elements corresponding to those in FIGS. 1A to 4K, and duplicated descriptions will be omitted.

Figure 5A:
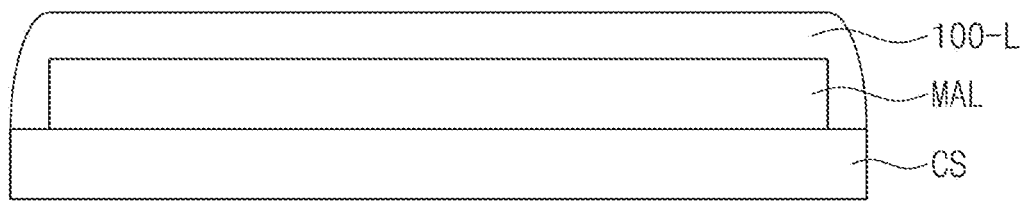
FIGS. 5A to 5G are cross-sectional views illustrating a method of manufacturing a display panel according to an embodiment of the inventive concept.

As illustrated in FIG. 5A, a base part 100-L may be formed on a carrier substrate CS and on a moisture absorption layer MAL. The moisture absorption layer MAL may be formed to cover at least a portion of the carrier substrate CS. Because the moisture absorption layer MAL has the same features as those illustrated in FIG. 4B, duplicated descriptions will be omitted.

The base part 100-L may be formed by applying an insulating material. In the current embodiment, the base part 100-L may have a shape to cover at least one surface of the moisture absorption layer MAL.

Particularly, the base part 100-L may be formed while a liquefied insulating material covers the top surface and side surfaces of the moisture absorption layer MAL. Accordingly, the base part 100-L may be divided into a region overlapping the moisture absorption layer MAL on a plane, and a region directly contacting the carrier substrate CS without overlapping the moisture absorption layer MAL.

Figure 5B:
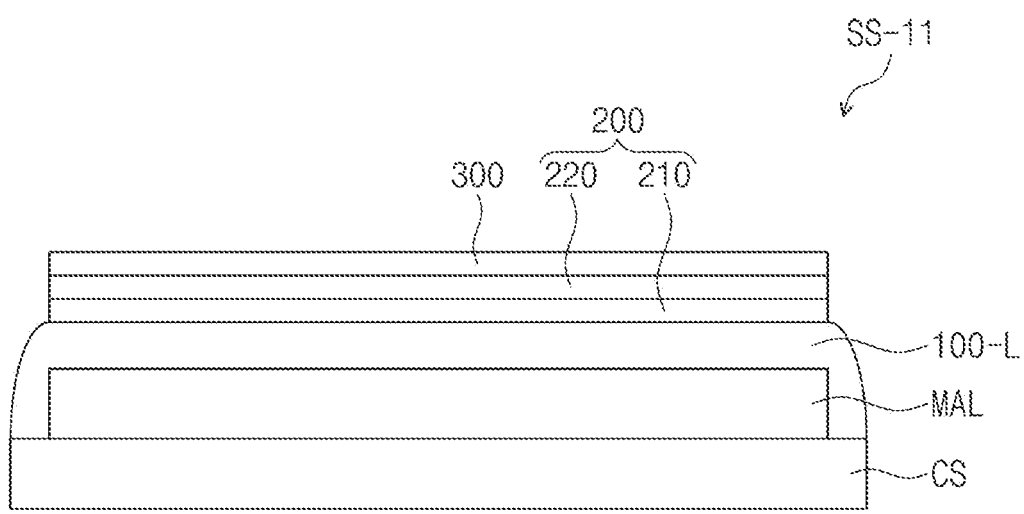

Then, as illustrated in FIG. 5B, a pixel part 200 and an encapsulation layer 300 are formed on the base part 100-L to form a stacked substrate SS-11. The pixel part 200 may include an array layer 210 and a display element layer 220. Detailed descriptions with respect to the above-described structure may be substituted with those described in FIGS. 4D and 4E, and their duplicated descriptions will be omitted.

The stacked substrate SS-11 illustrated in FIG. 5B may include the base part 100-L having a shape that is different from that of the stacked substrate SS illustrated in FIG. 4E. The stacked substrate SS-11 according to an embodiment of the inventive concept may include the base part 100-L that entirely covers moisture absorption layer MAL according to the difference in process and material. Accordingly, the stacked substrate SS-11 may include the moisture absorption layer MAL that is prevented from being in contact with the outside air and moisture.

Figure 5C:
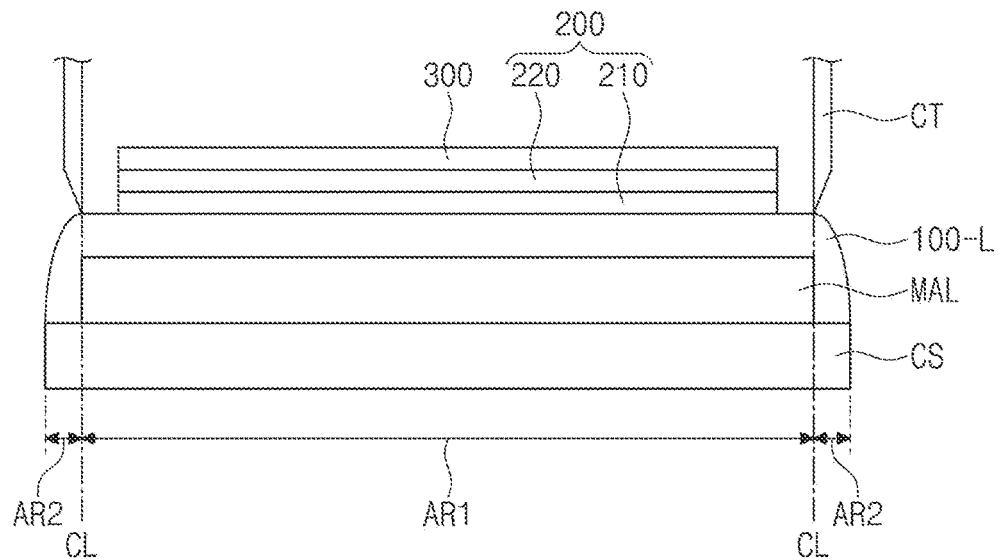
Figure 5D:
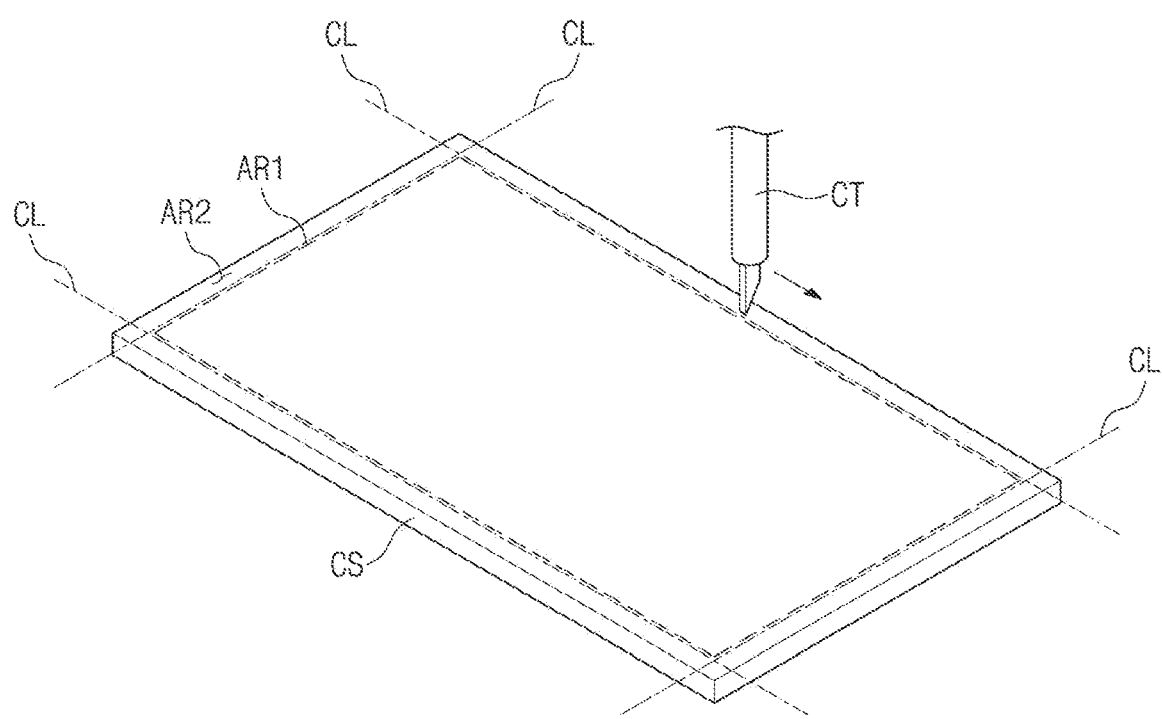
Figure 5E:
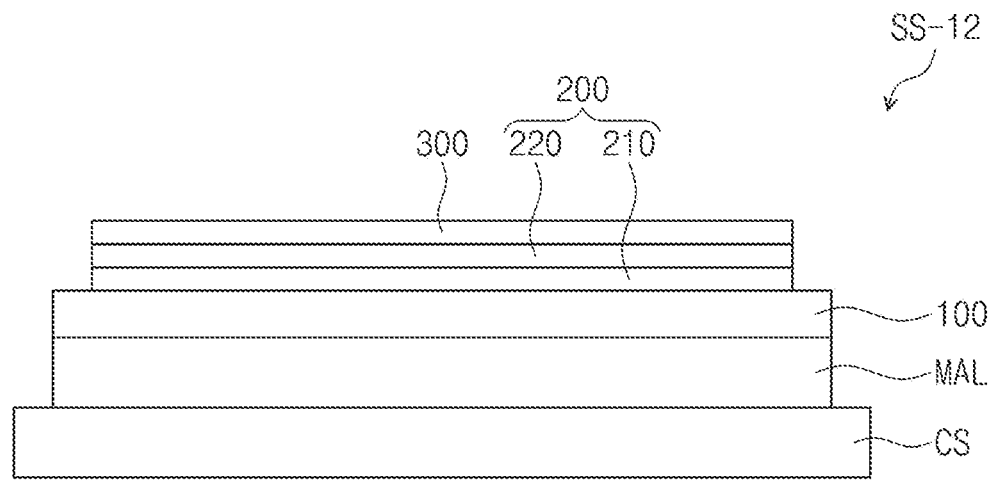

Then, as illustrated in FIG. 5C to 5E, a portion of the base part 100-L is cut to form a stacked substrate SS-12. The stacked substrate SS-12 may include the carrier substrate CS, the moisture absorption layer MAL, a base substrate 100, the pixel part 200, and the encapsulation layer 300. A first area AR1, which overlaps the moisture absorption layer MAL, of the base part 100-L may remain to form the base substrate 100.

Particularly, as illustrated in FIGS. 5C and 5D, the method of manufacturing the display panel according to an embodiment of the inventive concept may further include removing at least a portion of the base part 100-L to expose at least a portion of the moisture absorption layer MAL. The base part 100-L may be cut by a cutter CT along a cutting line CL defined on the base part 100-L.

The cutting line CL may be defined along the outside line of the moisture absorption layer MAL. The cutting line CL may be a boundary line between the first area AR1 of the base part 100-L, which overlaps the moisture absorption layer MAL and a second area AR2 of the base part 100-L, which does not overlap the moisture absorption layer MAL.

In FIG. 5D, the cutting line CL defined on the basis of the carrier substrate CS, the first area AR1, and the second area AR2 are illustrated as an example for ease of description. In the current embodiment, the cutting line CL may be defined as a rectangular shape surrounding the first area AR1. However, this is merely illustrated as an example. If the cutting line CL overlaps at least a portion of the outside line of the moisture absorption layer MAL, the cutting line CL may have various shapes and is not limited to one embodiment.

As illustrated in FIG. 5E, a portion of the base part 100-L is removed to form a substrate-shaped base part/base substrate 100. The base substrate 100 covers the top surface of the moisture absorption layer MAL, and allows the side surfaces of the moisture absorption layer MAL to be exposed. At least a portion of the side surfaces of the moisture absorption layer MAL may be exposed to the outside by removing a portion of the base part 100-L.

Accordingly, the stacked substrate SS-12 according to an embodiment of the inventive concept may include the moisture absorption layer MAL exposed to the outside, and the base substrate 100 having a cut portion. A suitable cutting surface may be present at an edge of the base substrate 100.

Figure 5F:
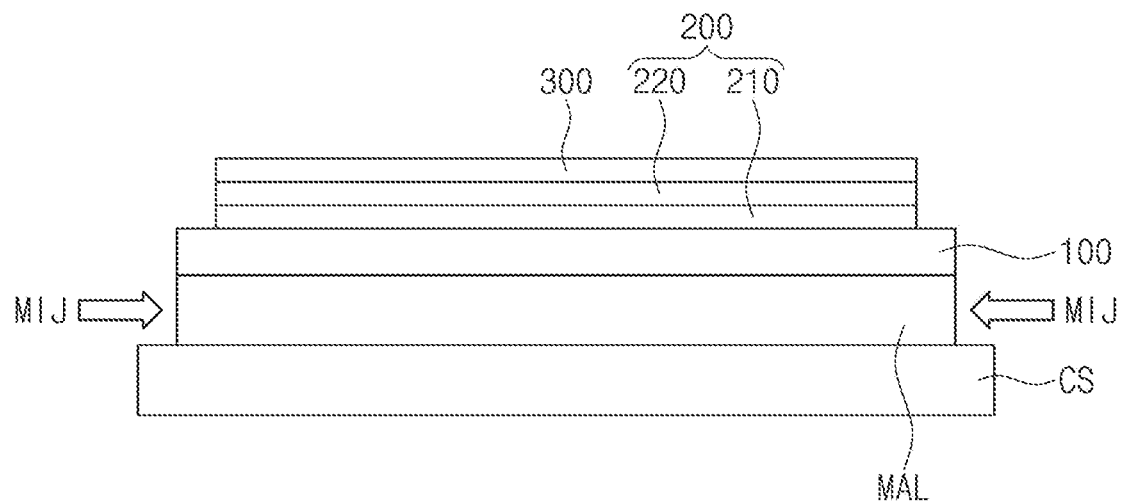
Figure 5G:
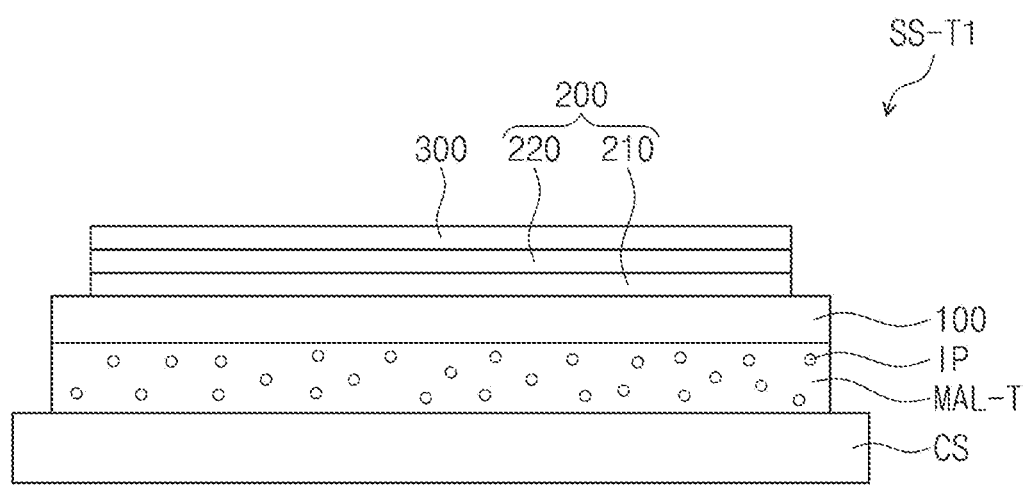

Then, as illustrated in FIGS. 5F and 5G, a porous moisture absorption layer MAL-T is formed to form a stacked substrate SS-T1. The porous moisture absorption layer MAL-T may be formed by injecting moisture MIJ into the moisture absorption layer MAL.

FIG. 5F may correspond to the stacked substrate SS illustrated in FIG. 4F, and FIG. 5G may correspond to the stacked substrate SS-T illustrated in FIG. 4G. Thus, detailed descriptions with respect to the above-described structure may be understood by referencing FIGS. 4F and 4G, and their duplicated descriptions will be omitted.

Then, the stacked substrate SS may be separated from the carrier substrate CS by pulling forces respectively applied in opposite directions through the vacuum pad VP (see FIG. 4I) and the stage ST (see FIG. 4I) described above, and the stacked substrate SS may thus formed into a display panel. Because detailed descriptions with respect to the above-described structure correspond to those with reference to FIGS. 4H to 4K, their duplicated descriptions will be omitted.

In the method of manufacturing the display panel according to an embodiment of the inventive concept, the base part 100-L may be formed to cover the moisture absorption layer MAL so that the moisture absorption layer MAL is prevented from being exposed. Accordingly, the moisture absorption layer MAL may be prevented from being prematurely damaged or deformed, in advance, due to outside moisture or contamination occurring during the processes prior to providing the moisture MIJ.

Also, the method of manufacturing the display panel according to an embodiment of the inventive concept may further include cutting a portion of the base part 100-L to stably protect the moisture absorption layer MAL until deforming the moisture absorption layer MAL. The base part 100-L may substantially function as a moisture barrier film of the moisture absorption layer MAL. Accordingly, the moisture absorption layer MAL may be stably protected without a separate additional process, thereby improving process reliability.

Figure 6A:
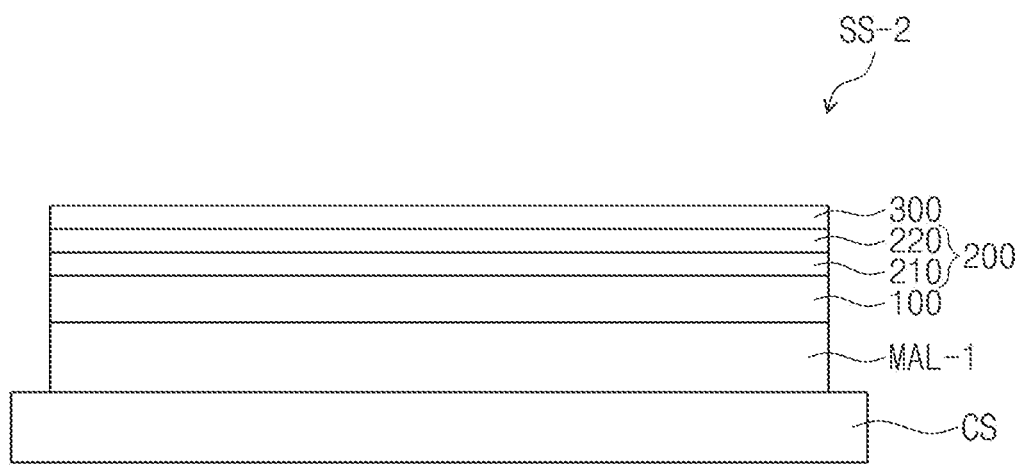
FIGS. 6A to 6C are cross-sectional views illustrating a method of manufacturing a display panel according to an embodiment of the inventive concept.
Figure 6B:
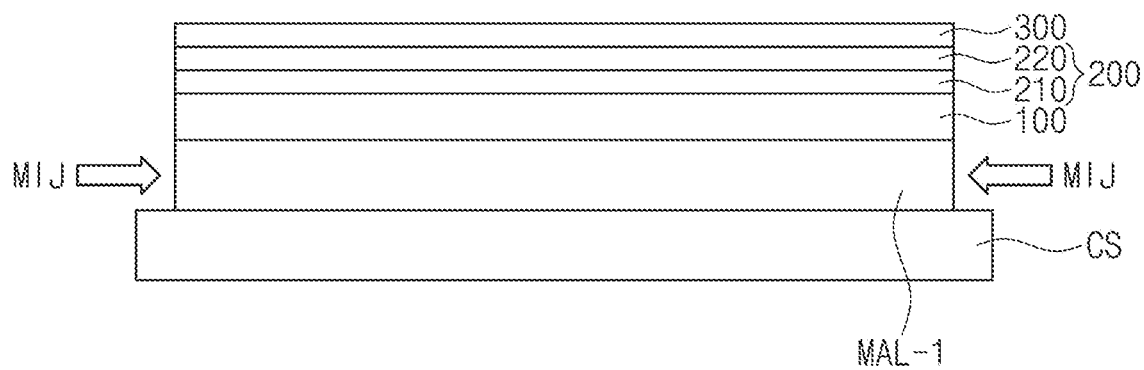
Figure 6C:
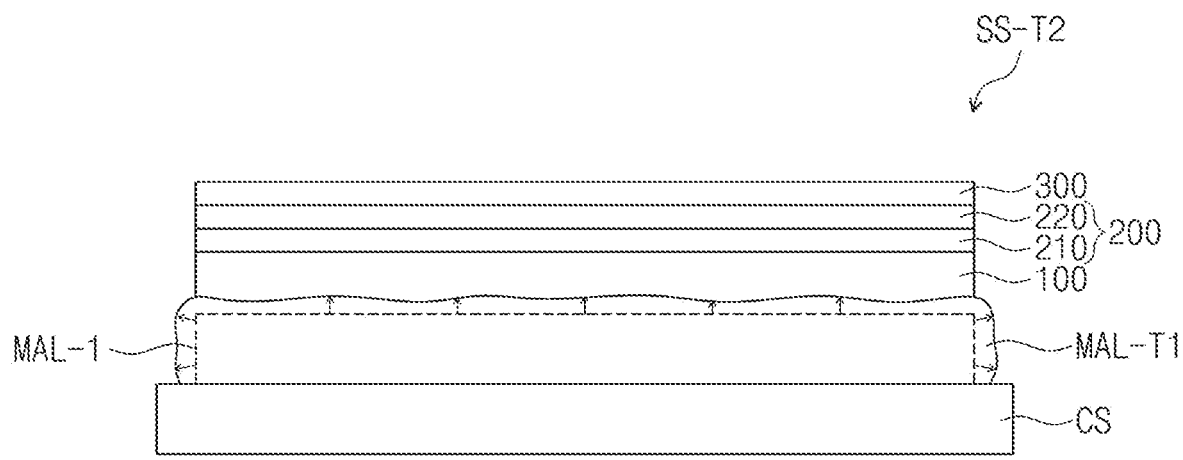

FIGS. 6A to 6C are cross-sectional views illustrating a method of manufacturing a display panel according to an embodiment of the inventive concept. In FIGS. 6A and 6C, only a portion of the processes corresponding to FIGS. 4E and 4G is illustrated. Hereinafter, an embodiment of the inventive concept will be described with reference to FIGS. 1 to 6C.

As illustrated in FIG. 6A, a stacked substrate SS-2 according to an embodiment of the inventive concept may include a carrier substrate CS, a moisture absorption layer MAL-1, a base substrate 100, a pixel part 200, and an encapsulation layer 300. Here, the moisture absorption layer MAL-1 may include a material having a characteristic of swelling when reacting with moisture.

As illustrated in FIGS. 6B and 6C, moisture MIJ is injected into the moisture absorption layer MAL-1 of the stacked substrate SS-2 to form a stacked substrate SS-T2. The stacked substrate SS-T2 includes a deformed moisture absorption layer MAL-T1. The moisture absorption layer MAL-1 of FIG. 6A (e.g., the moisture absorption layer MAL-1 prior to swelling) is illustrated in dotted line together with a deformed moisture absorption layer MAL-T1 after swelling for ease of description in FIG. 6C.

Here, the deformed moisture absorption layer MAL-T1 may be formed by expanding in volume from the moisture absorption layer MAL-1. The deformed moisture absorption layer MAL-T1 may be formed by being expanded from the form of the moisture absorption layer MAL-1 in several directions, as illustrated by arrow directions in FIG. 6C.

As the moisture absorption layer MAL-1 expands by reacting with the moisture MIJ, interface characteristics between the moisture absorption layer MAL-1 and the base substrate 100 may change. For example, the coupling force between the deformed moisture absorption layer MAL-T1 and the base substrate 100 in FIG. 6C may be weaker than that between the moisture absorption layer MAL-1 and the base substrate 100 in FIG. 6A.

The moisture absorption layer MAL-1 may include a material for causing volume deformation by introduction of the moisture MIJ. Interfacial adhesion area or adhesion force between the moisture absorption layer MAL-1 and the base substrate 100 may relatively decrease as the moisture absorption layer MAL-1 is changed into the deformed moisture absorption layer MAL-T1. Accordingly, the base substrate 100 may be easily separated from the carrier substrate CS thorough the deformed moisture absorption layer MAL-T1.

According to the embodiment of the inventive concept, the display panel including the base substrate, which is prevented from being damaged by the laser and the like, may be provided. Also, according to the embodiment of the inventive concept, the stacked substrate, in which the coupling force between the base substrate and the carrier substrate is easily controlled without laser irradiation, may be provided to simplify the processes. Also, according to the embodiment of the inventive concept, the base substrate may be stably separated from the carrier substrate without laser irradiation to improve the process reliability in manufacturing the display panel.

Although described with reference to preferred embodiments of the present invention, it will be understood that various changes and modifications of the present invention can be made by one skilled in the art or one having ordinary knowledge in the art without departing from the spirit and scope of the present invention as hereinafter claimed. Hence, the technical scope of the present invention is not limited to the detailed description in the specification, but should be determined only by reference to the claims and their functional equivalents.

What is claimed is:

1. A method of manufacturing a display panel, the method comprising:
   forming a moisture absorption layer comprising at least one of a silicon oxide, a chloride, a sulfur oxide, a bromine compound, a fluorine compound, or an indium compound on a carrier substrate, the moisture absorption layer having a number of pores formed therein;
   forming a base part on the moisture absorption layer;
   forming a pixel part comprising a plurality of pixels on the base part;
   injecting moisture into the moisture absorption layer to deform the moisture absorption layer; and
   separating the base part and the pixel part from the carrier substrate to form the display panel, the number of the pores causing the moisture absorption layer to be completely removed from the base part.

2. The method of claim 1, wherein the moisture absorption layer is deformed by the moisture to have at least one pore.

3. The method of claim 1, wherein the moisture absorption layer is expanded in volume by the moisture.

4. The method of claim 1, wherein the base part is formed through a solution process.

5. The method of claim 4, further comprising removing a portion of the base part prior to the injecting of the moisture,
   wherein the base part is formed to cover a top surface and side surfaces of the moisture absorption layer, and
   wherein the side surfaces of the moisture absorption layer are exposed from the base part by the removing of the portion of the base part.

6. The method of claim 5, wherein the portion of the base part is cut and removed along a cutting line defined on the base part, and
   the cut and removed portion does not overlap the moisture absorption layer in a plan view.

7. The method of claim 1, wherein, in the separating of the base part and the pixel part from the carrier substrate, a plurality of adsorption pads that adsorb the carrier substrate and the base part in directions opposite to each other are used.

8. The method of claim 1, wherein the carrier substrate comprises glass, and the base part comprises a resin.

* * * * *